United States Patent
Chen

(10) Patent No.: US 10,312,967 B2
(45) Date of Patent: **\*Jun. 4, 2019**

(54) SYSTEM AND METHOD FOR CROSS-TALK CANCELLATION IN SINGLE-ENDED SIGNALING

(71) Applicant: NVIDIA Corporation, Santa Clara, CA (US)

(72) Inventor: Xi Chen, Milpitas, CA (US)

(73) Assignee: NVIDIA Corporation, Santa Clara, CA (US)

(*) Notice: Subject to any disclaimer, the term of this patent is extended or adjusted under 35 U.S.C. 154(b) by 250 days.

This patent is subject to a terminal disclaimer.

(21) Appl. No.: 14/970,415

(22) Filed: Dec. 15, 2015

(65) Prior Publication Data

US 2017/0170869 A1    Jun. 15, 2017

(51) Int. Cl.
| | |
|---|---|
| G11C 5/06 | (2006.01) |
| G11C 7/18 | (2006.01) |
| H04B 3/32 | (2006.01) |
| H05K 3/22 | (2006.01) |
| H04L 25/02 | (2006.01) |
| H04L 25/08 | (2006.01) |

(52) U.S. Cl.
CPC .......... H04B 3/32 (2013.01); G11C 5/063 (2013.01); G11C 7/18 (2013.01); H04L 25/0272 (2013.01); H04L 25/085 (2013.01); H05K 3/222 (2013.01)

(58) Field of Classification Search
None
See application file for complete search history.

(56) References Cited

U.S. PATENT DOCUMENTS

| | | | | |
|---|---|---|---|---|
| 5,734,341 A | * | 3/1998 | Walker | H04J 3/0605 341/58 |
| 6,657,880 B1 | * | 12/2003 | Callahan | G11C 5/063 365/51 |
| 8,717,774 B2 | | 5/2014 | Randall et al. | |
| 8,737,521 B2 | | 5/2014 | Cornelius et al. | |
| 9,071,476 B2 | | 6/2015 | Fox et al. | |
| 9,106,220 B2 | | 8/2015 | Fox et al. | |
| 9,288,089 B2 | | 3/2016 | Cronie et al. | |
| 9,362,974 B2 | | 6/2016 | Fox et al. | |
| 9,385,066 B1 | | 7/2016 | Yoon et al. | |
| 9,582,451 B2 | | 2/2017 | Wanner et al. | |
| 9,882,605 B2 | | 1/2018 | Chen | |

(Continued)

OTHER PUBLICATIONS

Non-Final Office Action from U.S. Appl. No. 14/970,428, dated May 23, 2017.

(Continued)

*Primary Examiner* — Yaotang Wang
(74) *Attorney, Agent, or Firm* — Leydig, Voit & Mayer, Ltd.

(57) ABSTRACT

A method for transmitting data advantageously reduces cross-talk in high-speed data transmission. The method comprises receiving an input data word, encoding the input data word into a code word, and driving the code word on to an interconnect for transmission. The code word is generating using a balanced coding scheme, and the interconnect is a single-ended, twisted-wire on-chip fly-over interconnect. A receiver circuit decodes the code word to generate an output data word.

19 Claims, 17 Drawing Sheets

(56) References Cited

U.S. PATENT DOCUMENTS

| | | | |
|---|---|---|---|
| 2002/0056912 A1* | 5/2002 | Roth | H01L 23/5225 257/750 |
| 2003/0222282 A1* | 12/2003 | Fjelstad | H01L 23/49805 257/200 |
| 2016/0218894 A1* | 7/2016 | Fox | H04L 25/085 |
| 2016/0285456 A1 | 9/2016 | Fox et al. | |
| 2016/0351489 A1* | 12/2016 | Gu | H01L 23/50 |

OTHER PUBLICATIONS

Walter, D. et al., "A Source-Synchronous 90Gb/s Capacitively Driven Serial On-Chip Link Over 6mm in 65nm CMOS", IEEE ISSCC, 2012, pp. 180-182.

Oh, T. et al., "A 12-Gb/s Multichannel I/O Using MIMO Crosstalk Cancellation and Signal Reutilization in 65-nm CMOS", IEEE JSSC, Jun. 2013, vol. 48, No. 6, pp. 1383-1397.

U.S. Appl. No. 14/970,428, filed Dec. 15, 2015.

Notice of Allowance from U.S. Appl. No. 14/970,428, dated Sep. 21, 2017.

* cited by examiner

| Data Word 250 | | | | Balanced Code Word 252 | | | | | |
|---|---|---|---|---|---|---|---|---|---|
| D3 | D2 | D1 | D0 | TX6 | TX5 | TX4 | TX3 | TX2 | TX1 |
| 0 | 0 | 0 | 0 | 0 | 0 | 0 | 1 | 1 | 1 |
| 0 | 0 | 0 | 1 | 0 | 0 | 1 | 0 | 1 | 1 |
| 0 | 0 | 1 | 0 | 0 | 1 | 0 | 0 | 1 | 1 |
| 0 | 0 | 1 | 1 | 1 | 0 | 0 | 0 | 1 | 1 |
| 0 | 1 | 0 | 0 | 0 | 1 | 0 | 1 | 0 | 1 |
| 0 | 1 | 0 | 1 | 0 | 1 | 0 | 1 | 1 | 0 |
| 0 | 1 | 1 | 0 | 0 | 1 | 1 | 0 | 0 | 1 |
| 0 | 1 | 1 | 1 | 0 | 1 | 1 | 0 | 1 | 0 |
| 1 | 0 | 0 | 0 | 1 | 0 | 0 | 1 | 0 | 1 |
| 1 | 0 | 0 | 1 | 1 | 0 | 0 | 1 | 1 | 0 |
| 1 | 0 | 1 | 0 | 1 | 0 | 1 | 0 | 0 | 1 |
| 1 | 0 | 1 | 1 | 1 | 0 | 1 | 0 | 1 | 0 |
| 1 | 1 | 0 | 0 | 1 | 1 | 0 | 0 | 0 | 1 |
| 1 | 1 | 0 | 1 | 1 | 1 | 0 | 0 | 1 | 0 |
| 1 | 1 | 1 | 0 | 1 | 1 | 0 | 1 | 0 | 0 |
| 1 | 1 | 1 | 1 | 1 | 1 | 1 | 0 | 0 | 0 |

Encode →

← Decode

*Fig. 2B*

SYSTEM AND METHOD FOR CROSS-TALK CANCELLATION IN SINGLE-ENDED SIGNALING

FIELD OF THE INVENTION

The present invention relates to electrical signal transmission, and more particularly to systems and methods for cross-talk cancellation in single-ended signaling.

BACKGROUND

High-bandwidth transmission of data in on-chip and multi-chip module settings requires robust, energy-efficient signaling techniques. While conventional single-ended transmission techniques are suitable for short-distance data transmission, these techniques can suffer significant signal degradation due to cross-talk in longer-distance, high-density configurations needed for global fly-over and inter-chip data transmission. In certain high-speed, high-density parallel interconnect configurations, cross-talk among parallel data channels may limit the practical transmission distance to a few millimeters, which is generally inadequate for global fly-over and inter-chip transmission.

One technique for mitigating cross-talk is fully-differential signaling, with twisted channel pairs. However, this technique is relatively expensive as it requires twice as many signal wires per channel, and consequently may suffer reduced bandwidth density and energy efficiency compared to single-ended signaling. Another technique for mitigating cross-talk involves adding in-line analog compensation circuits to the receiver and/or transmitter end of a parallel signal channel. The analog compensation circuits implement a multiple-input, multiple-output equalizer having an appropriate frequency-domain matrix to compensate for channel response. However, this approach consumes significant power and requires additional die area and complexity to accommodate the analog compensation circuits. Thus, there is a need for addressing these issues and/or other issues associated with the prior art.

SUMMARY

A system and method enable transmission of data over a single-ended interconnect. The method comprises receiving an input data word for transmission, encoding the input data word into a code word, and driving the code word on to an interconnect for transmission. The input data word includes two or more independent bits of digital data. The interconnect is a single-ended, twisted-wire on-chip fly-over interconnect, and the interconnect includes signal wires corresponding to bits comprising the code word. The system comprises circuits configured to perform the above method. The system and method advantageously reduce cross-talk in high-speed data transmission.

BRIEF DESCRIPTION OF THE DRAWINGS

FIG. 2B illustrates a data word to balanced code word mapping, in accordance with one embodiment;

DETAILED DESCRIPTION

As integrated circuit and multi-chip module designs increase in density and complexity, data interconnects are required to span increasing distances and operate at high speeds. Embodiments of the present invention mitigate cross-talk commonly associated with longer data interconnects operating at the required high speeds. In certain embodiments, data is transmitted from one region of an integrated circuit die to another region of the same integrated circuit die through a fly-over interconnect fabricated as wires within upper metal layers of the die. In different embodiments, data is transmitted through an interposer interconnect implemented as wires within the interposer. For example, in one embodiment, the data may be transmitted from one region of an integrated circuit die to another region of the same die through the interposer interconnect. In another embodiment, the data may be transmitted from a first integrated circuit die to a second integrated circuit die through the interposer interconnect.

Two techniques are described herein to mitigate cross-talk. The first technique involves mapping data words into corresponding code words for transmission. In one embodiment, the code words are balanced code words. The balanced code words may balance the number of low-to-high and high-to-low transitions for an arbitrary transition from one code word to a different code word. Furthermore, the balanced code words may each have a balanced number of low and high logic levels. In certain embodiments, a one-to-one mapping may exist between a given data word and a corresponding code word. By transmitting only balanced code words over a given interconnect, aggressor-victim cross-talk noise coupled along the interconnect may be reduced. The second technique involves twisting wires comprising the interconnect to distribute cross-talk energy from each aggressor to all victims evenly by twisting single-ended channels.

In one embodiment, both the first technique and the second technique are implemented together such that data words are encoded into balanced code words, and the balanced code words are transmitted through an interconnect comprising twisted single-ended channels. In another embodiment, data words are transmitted through an interconnect comprising twisted single-ended channels.

Various embodiments of the present invention improve high-speed data transmission by advantageously reducing cross-talk in data interconnects. Signal integrity is improved with reduced cross-talk, enabling the data interconnects to operate over longer distances and at higher speeds.

Figure 1A:
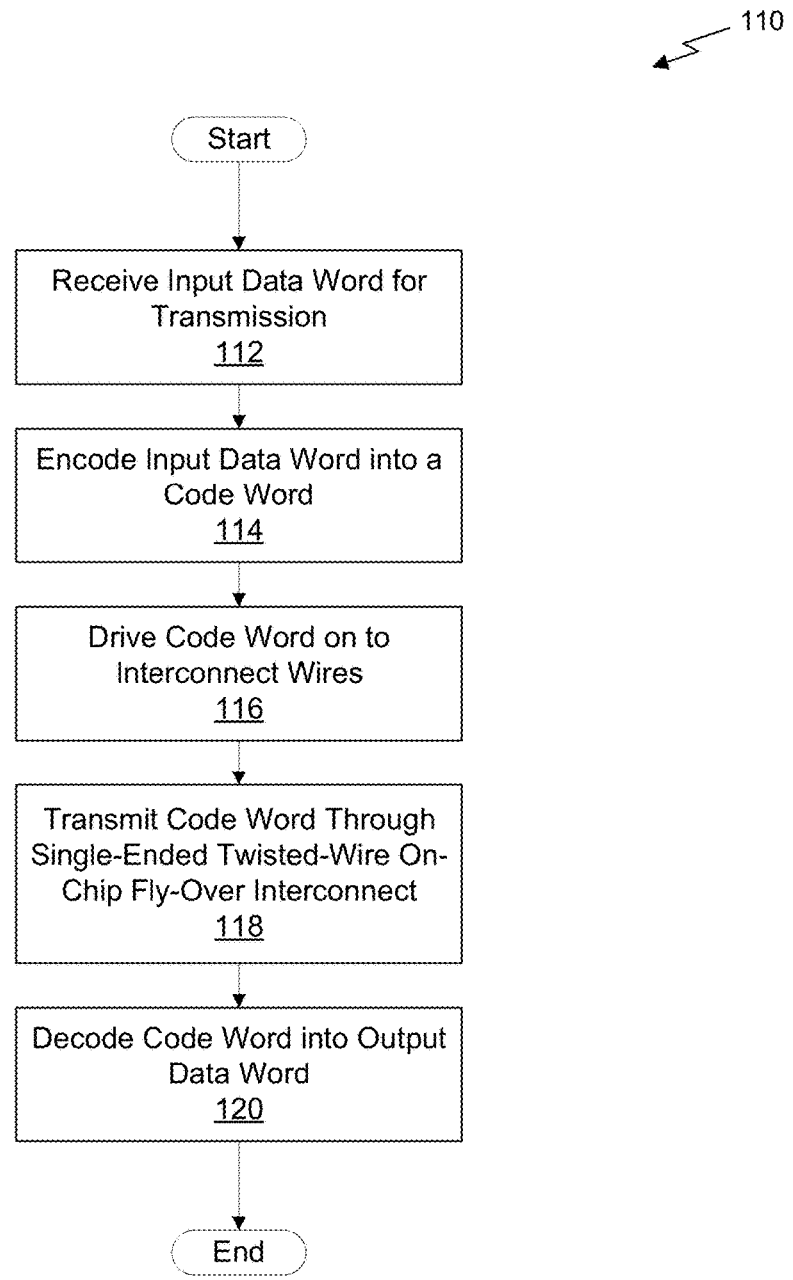
FIG. 1A is a flowchart of a method for transmitting an input data word through a single-ended twisted-wire on-chip fly-over interconnect, in accordance with one embodiment.

FIG. 1A is a flowchart of a method 110 for transmitting an input data word through a single-ended twisted-wire on-chip fly-over interconnect, in accordance with one embodiment. Although the method 110 is described in conjunction with the systems of FIGS. 2A, 4A-4B, 6, and 7, any system that implements method 110 is within the scope and spirit of embodiments of the present invention. In one embodiment, method 110 is implemented by a data transmitter circuit, such as data transmitter circuit 230 within integrated circuit 410 of FIGS. 4A-4B. Data may be received and decoded by a data receiver circuit, such as data receiver circuit 231. In general, a data transmitter circuit is configured to drive data words through a twisted-wire on-chip fly-over interconnect for transmission to a data receiver circuit.

At step 112, the data transmitter circuit receives an input data word for transmission. The data word may comprise two or more independent bits of digital data that may be generated in a common synchronous clock domain associated with the data transmitter circuit. In step 114, the data transmitter circuit encodes the data word into a code word for transmission. In one embodiment, the code word is a balanced code word. Each balanced code word may include a balanced number of transitions from any arbitrary different code word so that a balanced number of low-to-high and high-to-low transitions are transmitted through the interconnect for each corresponding data word. Alternative embodiments may implement different techniques for generating code words having various properties. In one alternative embodiment, each code word is equivalent to a corresponding data word and cross-talk mitigation is achieved primarily through the physical twisting structure of the interconnect, described in greater detail below.

In step 116, the data transmitter circuit drives a code word on to wires comprising the interconnect. In one embodiment, driving the code word comprises driving each wire of the interconnect to a high or low voltage level based on the logic value of a corresponding bit of the code word. A single-ended signal buffer may be used to drive a given wire of the interconnect. In step 118, the code word is transmitted through a single-ended twisted-wire on-chip fly-over interconnect. The twisted-wire structure rotates each single-ended interconnect wire through different interconnect lane positions along the interconnect path. The twisted-wire structure is described in greater detail below. In one embodiment, an on-chip fly-over interconnect comprises upper metal layer wires and associated vias for coupling lower-level wire signals to the upper metal layer wires. Such upper metal layers conventionally implement power distribution networks and global signals, such as global clock signals. For example, in an eight metal layer process, metal layers seven and eight may be configured to implement the fly-over interconnect as well as power distribution networks.

In step 120, the data receiver circuit decodes the code word into an output data word corresponding to the input data word. The data receiver circuit may receive the code word from the single-ended twisted-wire on-chip fly-over interconnect. The output data word may be further transmitted to an appropriate module within the integrated circuit.

Figure 1B:
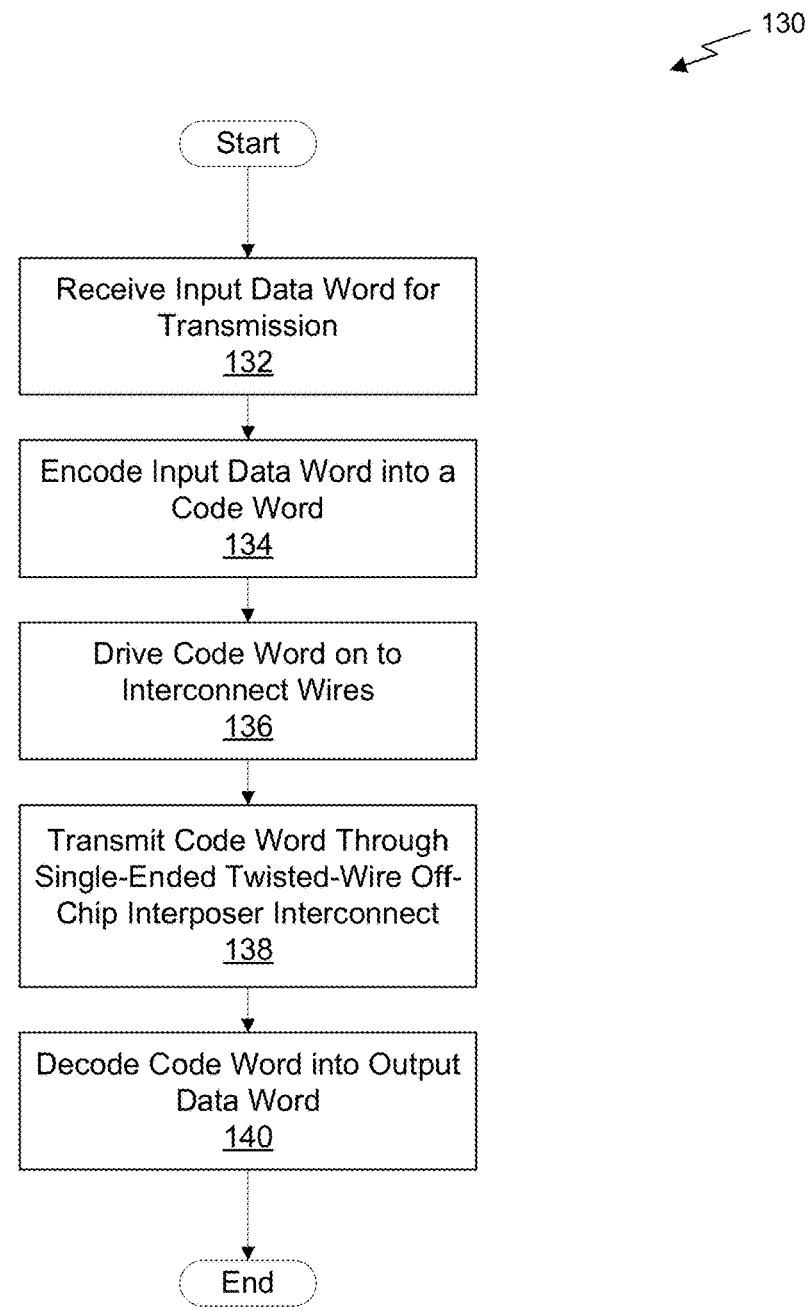
FIG. 1B is a flowchart of a method for transmitting an input data word through a single-ended twisted-wire off-chip interposer interconnect, in accordance with one embodiment.

FIG. 1B is a flowchart of a method 130 for transmitting an input data word through a single-ended twisted-wire off-chip interposer interconnect, in accordance with one embodiment. Although the method 130 is described in conjunction with the systems of FIGS. 2A, 4C-4D, 6, and 7, any system that implements method 130 is within the scope and spirit of embodiments of the present invention. In one embodiment, method 130 is implemented by a data transmitter circuit, such as data transmitter circuit 232 or data transmitter circuit 234 within integrated circuit 450 of FIGS. 4C-4D. Data may be received and decoded by a data receiver circuit, such as data receiver circuit 231 or data receiver circuit 235. In general, a data transmitter circuit is configured to drive data words through a twisted-wire off-chip interposer interconnect for transmission to a data receiver circuit.

At step 132, the data transmitter circuit receives an input data word for transmission. The data word may comprise two or more independent bits of digital data that may be generated in a common synchronous clock domain associated with the data transmitter circuit. In step 134, 134, the data transmitter circuit encodes the data word into a code word for transmission. In one embodiment, the code word is a balanced code word. Each balanced code word may include a balanced number of transitions from any arbitrary different code word so that a balanced number of low-to-high and high-to-low transitions are transmitted through the interconnect for each corresponding data word. Alternative embodiments may implement different techniques for generating code words having various properties. In one alternative embodiment, each code word is equivalent to a corresponding data word and cross-talk mitigation is achieved primarily through the physical twisting structure of the interconnect, described in greater detail below.

In step 136, the data transmitter circuit drives a code word on to wires comprising the interconnect. In one embodiment, driving the code word comprises driving each wire of the interconnect to a high or low voltage level based on the logic value of a corresponding bit of the code word. A single-ended signal buffer may be used to drive a given wire of the interconnect. In step 138, the code word is transmitted through a single-ended twisted-wire off-chip interposer interconnect. The twisted-wire structure rotates each single-ended interconnect wire through different interconnect lane positions along the interconnect path within an interposer device. The twisted-wire structure is described in greater detail below. In one embodiment, an off-chip interposer interconnect comprises metal wires fabricated within the interposer device and associated vias, and bump/ball structures for coupling the interposer interconnect to the data transmitter circuit.

In step 140, the data receiver circuit decodes the code word into an output data word corresponding to the input data word. The data receiver circuit may receive the code word from the single-ended twisted-wire off-chip interposer interconnect. The output data word may be further transmitted to an appropriate module within an integrated circuit associated with the data receiver circuit. The data receiver circuit may be disposed within the same integrated circuit as the data transmitter circuit or the data receiver circuit may be disposed within a different integrated circuit as the data transmitter circuit. Both scenarios are illustrated below in FIG. 4C.

Figure 2A:
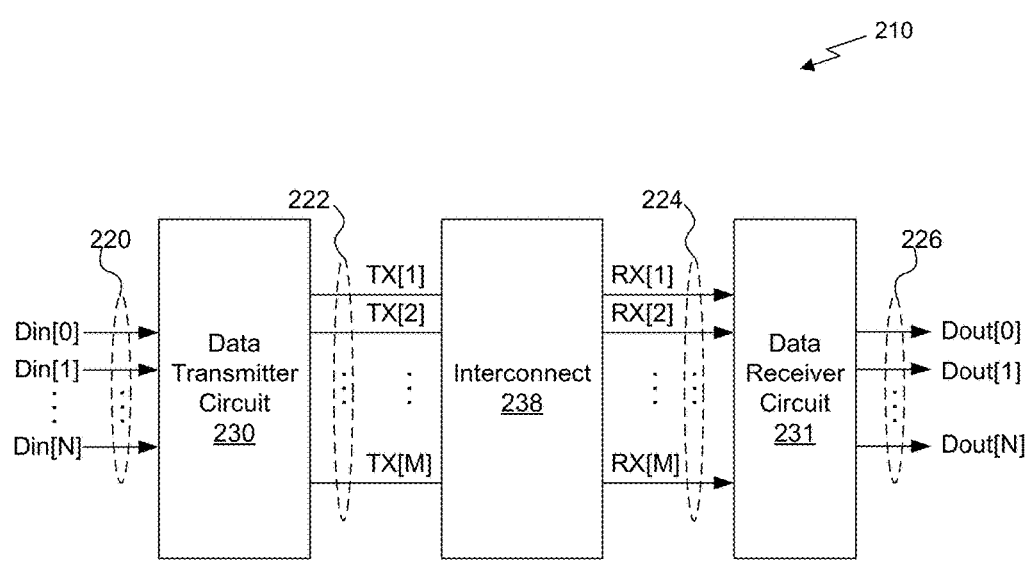
FIG. 2A illustrates a system configured to transmit an input data word through an interconnect, in accordance with one embodiment.

FIG. 2A illustrates a system 210 configured to transmit an input data word 220 through an interconnect 238, in accordance with one embodiment. As shown, system 210 includes a data transmitter circuit 230, the interconnect 238, and a data receiver circuit 231. The data transmitter circuit 230 may receive input data word 220 and generate a corresponding code word 222 for transmission through interconnect 238. The input data word 220 may comprise a set of digital bits, each corresponding to one data input wire Din. A logic level (0 or 1) for each digital bit may be represented as an electrical signal, such as a voltage level. In one embodiment, embodiment, logic levels are generally represented as a voltage, wherein a low voltage level represents a logical 0 and a high voltage level represents a logical 1. The code word 222 may comprise a set of digital bits, each corresponding to one code word node TX. The interconnect 238 may be configured to transmit a voltage level from each code word node TX to a corresponding receiver-side code word node RX. A receiver-side code word 224 may be represented by a set of digital bits, each corresponding to one code word node RX. Each code word node TX[1] through TX[M] may be electrically connected (i.e., coupled), such as through a wire, to a corresponding code word node RX[1] through RX[M]. In one embodiment, the input data word 220 includes four bits (N=3), and the code word 224 includes six bits (M=6). M and N are integer number and M may be equal to or larger than N+1. The code word 224 should should be logically identical to a corresponding code word 222 transmitted by the data transmitter circuit 230. The data receiver circuit 231 receives code word 224 and maps the code word 224 to an output data word 226. The output data word 226 may comprise a set of digital bits, each corresponding to one data output wire Dout.

In one embodiment, data transmitter circuit 230, interconnect 238, and data receiver circuit 231 are disposed within an integrated circuit. In such an embodiment, interconnect 238 may comprise a single-ended twisted-wire on-chip fly-over interconnect fabricated to include two or more upper metal layers of the integrated circuit. In another embodiment, the interconnect 238 may comprise a single-ended twisted-wire off-chip interposer interconnect fabricated to include metal layers within an interposer device. In certain embodiments, the data transmitter circuit 230 may be fabricated within the same integrated circuit die as the data receiver circuit 231. In certain other embodiments, the transmitter circuit 230 may be fabricated within a different integrated circuit die as the data receiver circuit 231.

FIG. 2B illustrates a data word 250 to balanced code word 252 mapping, in accordance with one embodiment. As shown, each possible four-bit pattern for a data word 250 has a one-to-one mapping with a corresponding six-bit pattern for a balanced code word 252. In this exemplary mapping, each possible transition from one balanced code word to a different balanced code word has the property of inverting an identical number of bits. In other words any any two different balanced code words differ by an identical number of bits going from 1 (high) to 0 (low) and from 0 to 1. Sequentially transmitting two different balanced code words over an interconnect therefore has a property of generating an equal number of low-to-high and high-to-low transitions between the two balanced code words. This property applies to any two balanced balanced code words transmitted in any sequence. Furthermore, this property generally reduces aggressor-victim cross-talk within the interconnect because aggressor channels generate opposing cross-talk currents.

A data transmitter circuit may receive an incoming data word and map the data word to corresponding balanced code words for transmission through an interconnect. A data receiver circuit may receive an incoming balanced code word from the interconnect and map the balanced code word to a corresponding data word for use in an associated circuit module. In one embodiment, data transmitter circuit 230 of FIG. 2A encodes an input data word 220 by mapping the input data word to a corresponding balanced code word 252 for transmission over interconnect 238. In such an embodiment, data receiver circuit 231 performs a reverse mapping from the balanced code word 252 to a data word 250 to generate an output data word 226.

The exemplary mapping shown here between a four-bit data word and a six-bit balanced code word serves to illustrate the concept of a balanced code word and in no way limits the number of data word bits that may be mapped to a balanced code word.

In one embodiment, encoding (i.e. mapping) the data word to 250 to a corresponding code word 252 is performed using a look-up table circuit, such as a read-only memory lookup table circuit or a direct logic circuit implementation of the look-up table. Similarly, decoding a code word 252 into a corresponding data word 252 may be performed using a reverse look-up table.

Figure 3A:
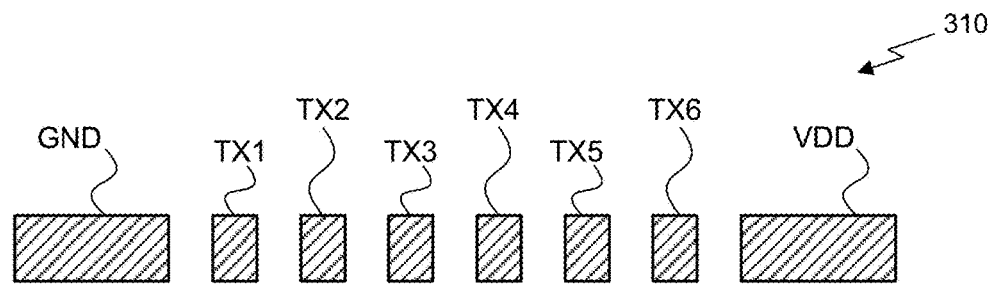
FIG. 3A illustrates a cross-section of a wire group, in accordance with one embodiment.

FIG. 3A illustrates a cross-section of a wire group 310, in accordance with one embodiment. As shown, the wire group 310 includes code word nodes TX1 through TX6, along with a ground (GND) node and a positive supply (VDD) node. The wire group 310 may form a portion of an interconnect, such as interconnect 238 of FIG. 2A.

Figure 3B:
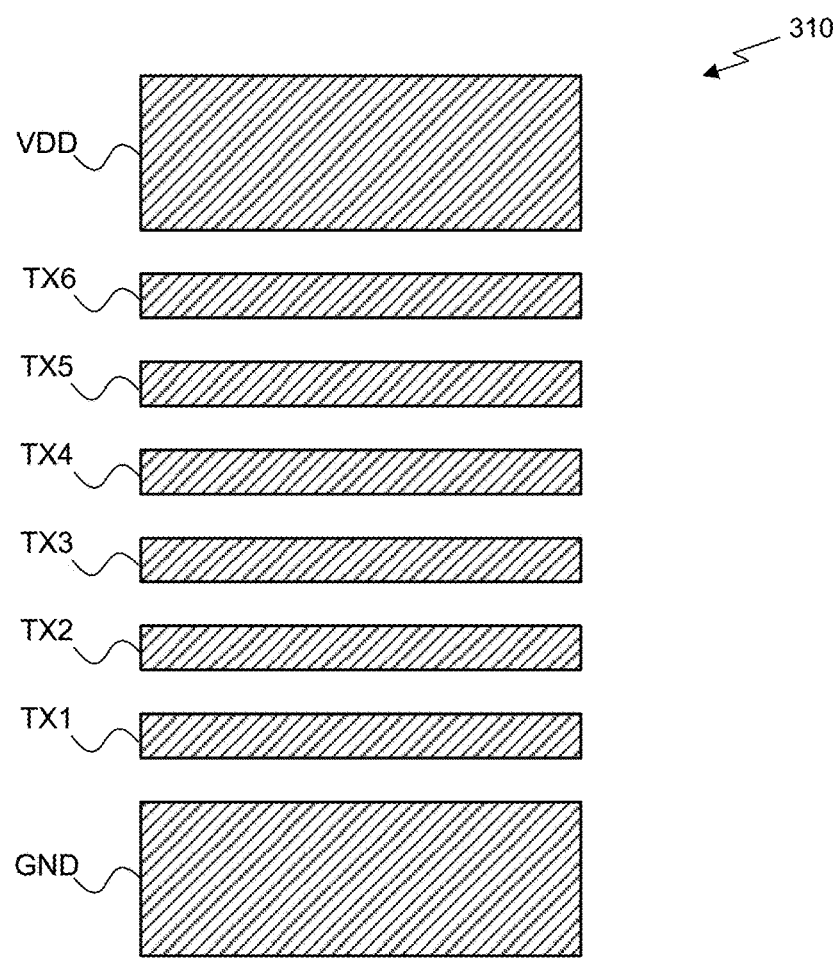
FIG. 3B illustrates a top view of a wire group, in accordance with one embodiment.

FIG. 3B illustrates a top view of the wire group 310, in accordance with one embodiment. As shown, wires for coupling GND and VDD nodes may be routed alongside wires comprising the wire group 310. Only a short, exemplary portion of wire group 310 is shown here. In a practical implementation, such as an implementation of interconnect 238, fabricated wires associated with TX1 through TX6 are routed from data transmitter circuit 230 to data receiver circuit 231 within one or more integrated circuits.

Figure 3C:
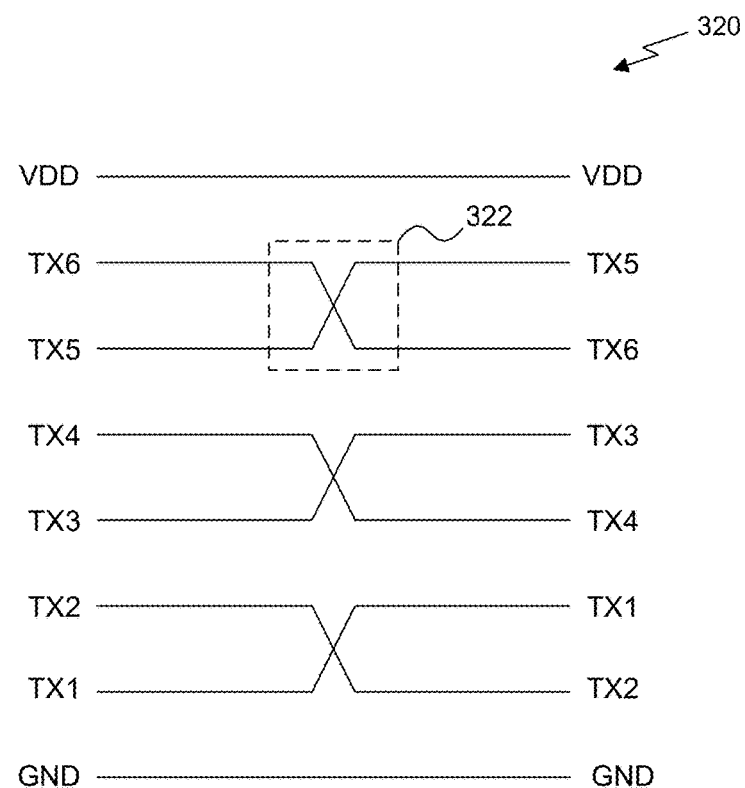
FIG. 3C illustrates a schematic view of a wire group configured to include single-twist structures, in accordance with one embodiment.

FIG. 3C illustrates a schematic view of a wire group 320 configured to include single-twist structures, in accordance with one embodiment. As shown, a single-twist structure 322 may be configured to twist or swap the position of associated wires along a path formed by the wires. In this example, nodes TX5 and TX6 are twisted along the path formed by the associated wires. Similarly, as shown in FIG. 3C, single-twist structures for wire group 320 may also twist TX3 and TX4, as well as TX1 and TX2.

Figure 3D:
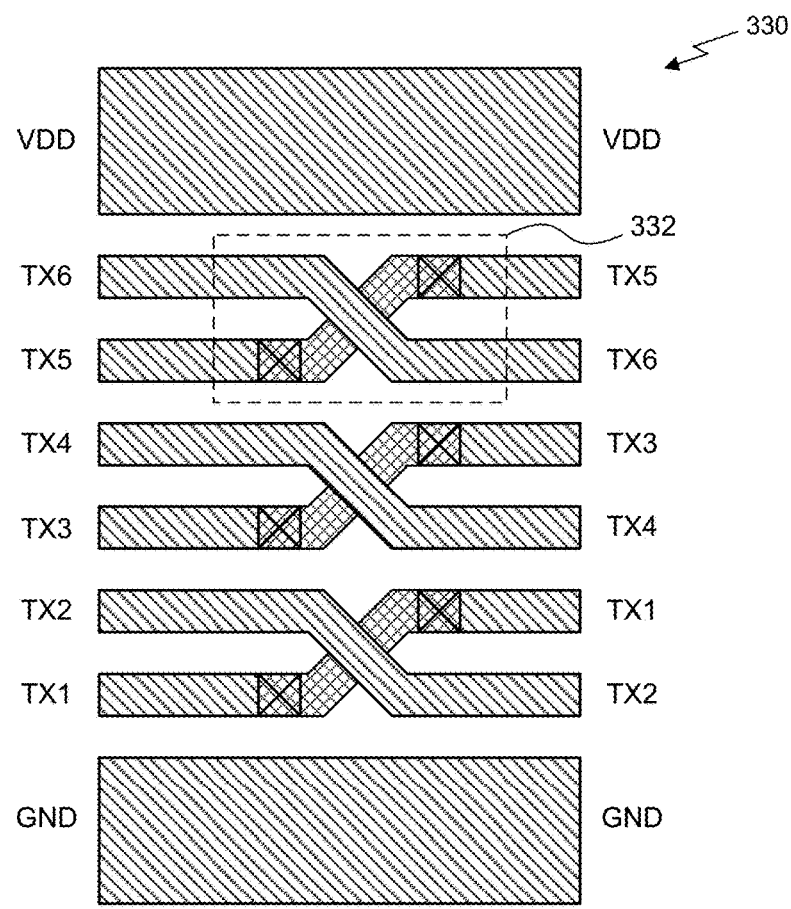
FIG. 3D illustrates physical layout for a wire group configured to include single-twist structures, in accordance with one embodiment.

FIG. 3D illustrates physical layout for a wire group 330 configured to include single-twist structures, in accordance with one embodiment. The single-twist structures may be implemented as physical structures having two different metal layers and a via layer. As shown, wires implemented in an upper metal layer (N) are depicted using a diagonal fill pattern, while wires implemented in a lower metal layer (N−1) are depicted using a cross-hatch fill pattern. A via connecting the upper metal layer and the lower metal layer is depicted as a square with a diagonal cross. An exemplary single-twist structure 332 may implement a single-twist structure associated with nodes TX5 and TX6. Similarly, as shown in FIG. 3D, single-twist structures for wire group 332 may also twist TX3 and TX4, as well as TX1 and TX2. In one embodiment, physical design and layout for wire group 320 of FIG. 3C may be implemented according to the physical structures depicted for wire group 330. More generally, two different metal layers may implement a wire group associated with an interconnect, such as interconnect 238, and twist structures may be implemented according to single-twist structure 332. In other embodiments, more than two different metal layers and connecting vias may be used to implement the single-twist structure 332. Furthermore, multiple-twist structures may be implemented by extending the physical structure of single-twist structure 332 to traverse two or more wire lanes instead of the one traversal shown.

Figure 3E:
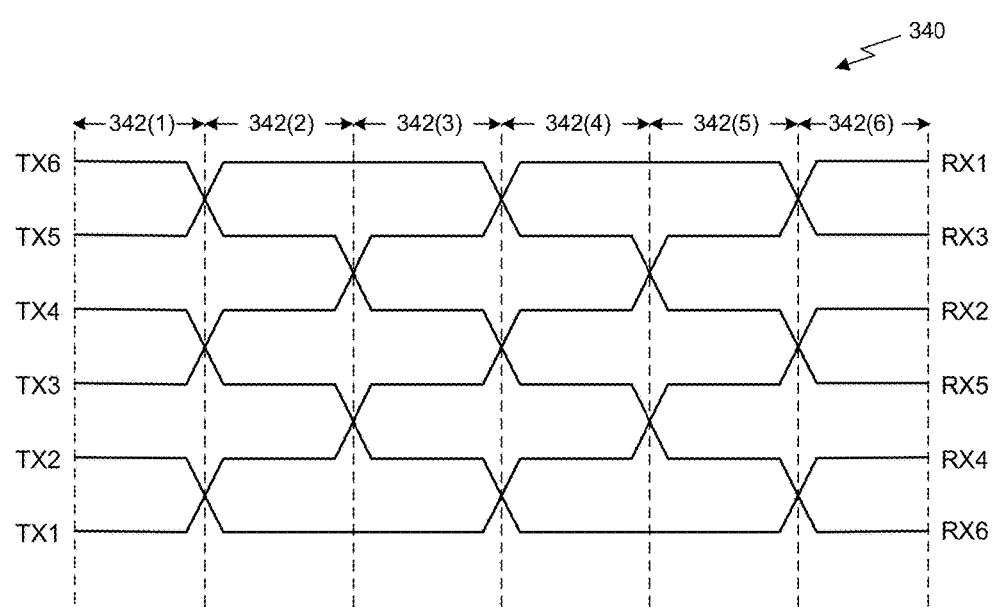
FIG. 3E illustrates a schematic view of a wire group configured to include multiple segments comprising single-twist structures, in accordance with one embodiment.

FIG. 3E illustrates a schematic view of a wire group 340 configured to include multiple segments 342 comprising single-twist structures, in accordance with one embodiment. As shown, wire group 340 includes six segments 342, each associated with single-twist structures on each end. In other embodiments, wire group 340 may include fewer or additional segments (not shown). In one embodiment, when a single-twist structure is used, the number of segments is an integer multiple of the number of wires. As shown in FIG. 3E, at least one wire wire in the wire group 340 twists at a boundary between two of the six segments 342. The single-twist structure 322 may be fabricated at one or more boundaries between the segments 342. In one embodiment, nodes TX1 through TX6 are electrically coupled to nodes RX1 through RX6, respectively. Furthermore, nodes TX1 through TX6 may be coupled to data transmitter circuit 230, and nodes RX1 through RX6 may be coupled to data receiver circuit 231, with interconnect 238 implemented to include wire group 340. In one embodiment, within each segment 342, the wires in the wire group 340 are routed in parallel and are substantially equal in length.

Figure 3F:
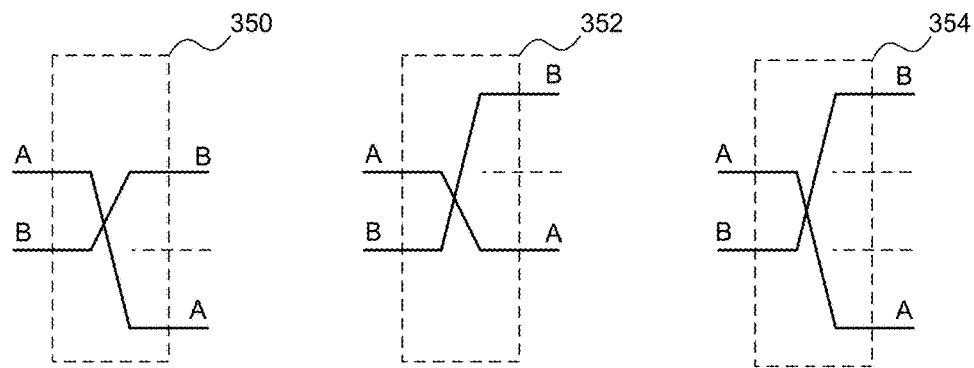
FIG. 3F illustrates a schematic view of double-twist structures, in accordance with one embodiment.

FIG. 3F illustrates a schematic view of double-twist structures 350, 352, 354, in accordance with one embodiment. As shown, double-twist structure 350 twists node A and node B, with node B twisted up one lane up and node A twisted down two lanes. Double-twist structure 352 twists node A and node B, with node A twisted down one lane and node B twisted up two lanes. Double-twist structure 354 twists node A and node B, with node A twisted down two lanes and node B twisted up two lanes. The double-twist structures 350, 352, 354 may be combined within a wire group to implement various interconnect configurations, as shown below in FIGS. 3G and 3H. Furthermore, the double-twist structures 350, 352, 354 may be implemented using two different metal layers and connecting vias, as illustrated previously in FIG. 3D. In other embodiments, more than two different metal layers and connecting vias may be used to implement the double-twist structures 350, 352, 354.

Figure 3G:
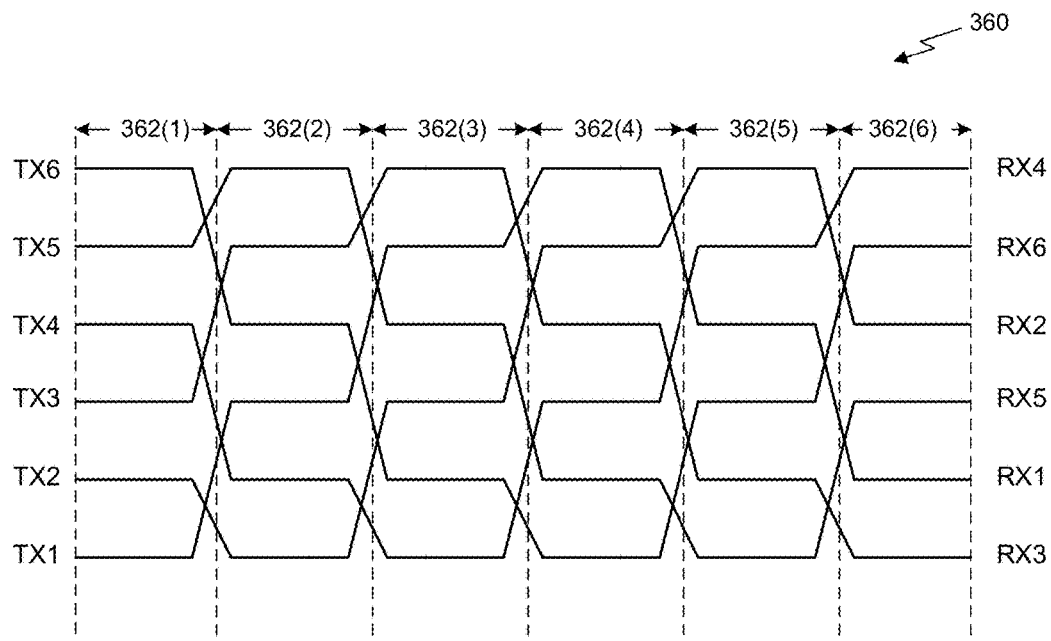
FIG. 3G illustrates a schematic view of a wire group configured to include multiple segments comprising double-twist structures, in accordance with one embodiment.

FIG. 3G illustrates a schematic view of a wire group 360 configured to include multiple segments 362 comprising double-twist structures, in accordance with one embodiment. As shown, wire group 360 includes six wires, that each traverses six segments 362. As shown in in FIG. 3G, at least one wire in the wire group 360 twists at a boundary between two of the six segments 362. One or more of the double-twist structures 350, 352, and/or 354 may be fabricated at boundaries between segments 362. In one embodiment, nodes TX1 through TX6 are electrically coupled to nodes RX1 through RX6, respectively. Furthermore, nodes TX1 through TX6 may be coupled to data transmitter circuit 230, and nodes RX1 through RX6 may be coupled to data receiver circuit 231, with interconnect 238 implemented to include wire group 360. In one embodiment, within each segment 362, the wires in the wire group 360 are routed in in parallel and are substantially equal in length.

In one embodiment, when a double-twist structure is used, the number of segments is an integer multiple of half the number of wires. For example, a group of six wires may be implemented as six segments of single-twist structures, or as three segments of double-twist structures. In one embodiment, a group of six wires implemented as three segments of double-twist structures provides similar cross-talk reduction performance compared to six-segments of single-twist structures. And six-segments of double-twist structure may provide better cross-talk reduction performance compared to three-segments of double-twist structure and six-segments of single-twist structure. Using more segments than the number of wires is possible, but may not be cost effective, because no additional cross-talk reduction may be realized.

Figure 3H:
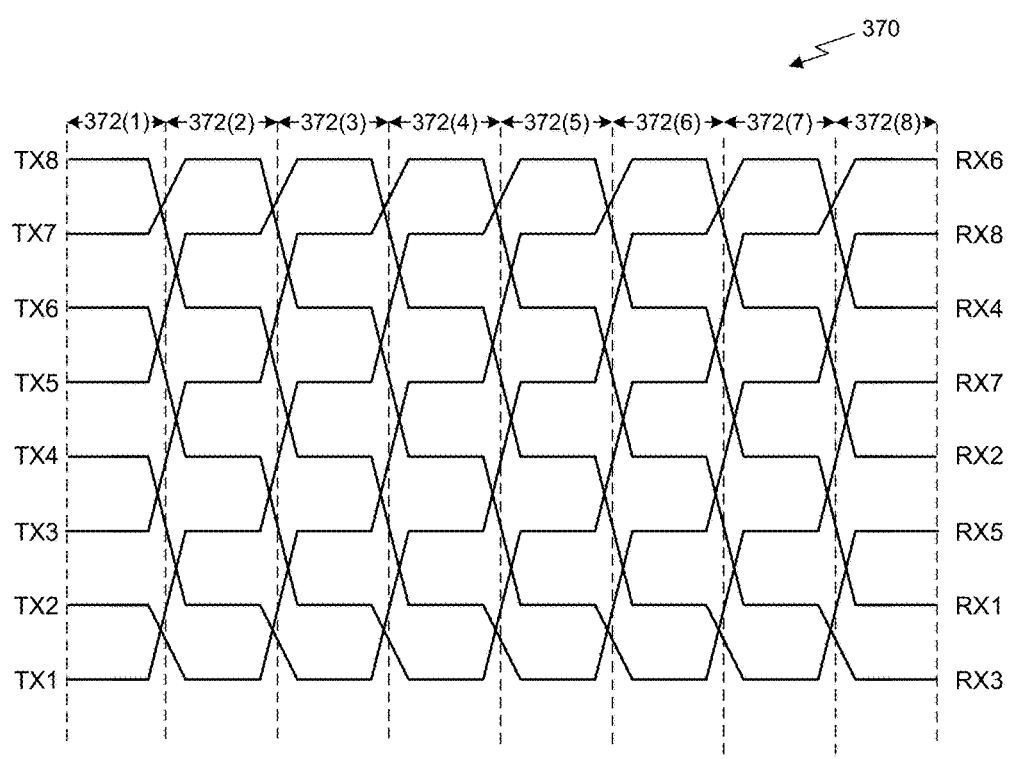
FIG. 3H illustrates a schematic view of a wire group of eight signal wires configured to include multiple segments comprising double-twist structures, in accordance with one embodiment.

FIG. 3H illustrates a schematic view of a wire group 370 of eight signal wires configured to include multiple segments 372 comprising double-twist structures, in accordance with one embodiment. As shown, each of the eight signal wires is associated with a different input node TX1 through TX8 and a corresponding output node RX1 through RX8. Each input node TX1 through TX8 is electrically coupled through a different one of the eight signal wires to a corresponding output node RX1 through RX8. Furthermore, each of the eight signal wires passes through eight segments 372.

One property of the exemplary twisting patterns associated with wire groups 340, 360, 370 is that each wire within a given wire group traverses approximately the same distance as a potential aggressor and victim with respect to each other wire within the wire group, thereby averaging cross-talk from each potential aggressor to each potential victim substantially evenly. Supply nodes VDD and GND may not be given equal treatment as aggressor or victim wires relative to signal wires.

Averaging as an independent strategy to reduce cross-talk beneficially distributes and reduces aggressor-victim cross-talk. When such averaging is combined with balanced coding, as described previously, cross-talk may be further reduced. In each transition from one balanced code to a different balanced code, an equal number of low-to-high and high-to-low transitions are driven along signal wires comprising a wire group. Consequently, each victim wire within a wire group will be subjected equally to low-going and high-going cross talk before traversing all segments associated with the wire group.

While all low-going cross-talk may not be coupled onto the victim wire at the same physical location (segment)

within the wire group as all high-going cross-talk, both low-going and high-going cross-talk will be coupled substantially evenly onto the victim wire at an appropriate time to provide substantial net cancellation of both. Such cancellation may be distributed over different segments, but will occur at an appropriate time in the victim wire signal to provide proper cancellation.

For example, in the case of a data word 250 transition from "0000" to "0001," a corresponding balanced code word 252 transition from "000111" to "001011" may be driven onto nodes TX1 through TX6 of interconnect 238 comprising a wire group 360. In this exemplary transition, TX3 is driven from 1 to 0 (high-to-low), and TX4 is driven from 0 to 1 (low-to-high). During the transition, TX3 and TX4 may be considered aggressors because they are both changing electrical state, and any wires within proximity to TX3 and TX4 may be considered victims. Cross-talk cancellation may be illustrated by following the signal wire associated with node TX2 to node RX2 in FIG. 3G. In segment 362(1), TX2 is adjacent to TX3 and TX2 is subjected to high-to-low cross-talk. In one embodiment, adjacent wires are routed in parallel and are substantially equal in length. In segment 362(2), TX2 is adjacent to TX4 and TX2 is subjected to low-to-high cross-talk. In segment 362(4), TX2 is again adjacent to TX3 and TX2 is again subjected to high-to-low cross-talk. In segment 362(5), TX2 is again adjacent to TX4 and TX2 is again subjected to low-to-high cross-talk. Overall, a wire associated with TX2 is subjected to cross-talk that is substantially balanced. In one embodiment, electrical signals associated with TX1 through TX6 are substantially aligned in phase and are generated synchronously, thereby causing cross-talk cancellation to also occur in proper phase alignment with victim signal phase.

An interconnect, such as interconnect 238, may include one or more instances of a wire group, such as wire group 340, 360, 370. Multiple instances of a wire group may implement concurrent operation for wider data paths within interconnect 238. Alternatively, one or more wider balanced code words may be implemented for a wider data path within interconnect 238.

Figure 4A:
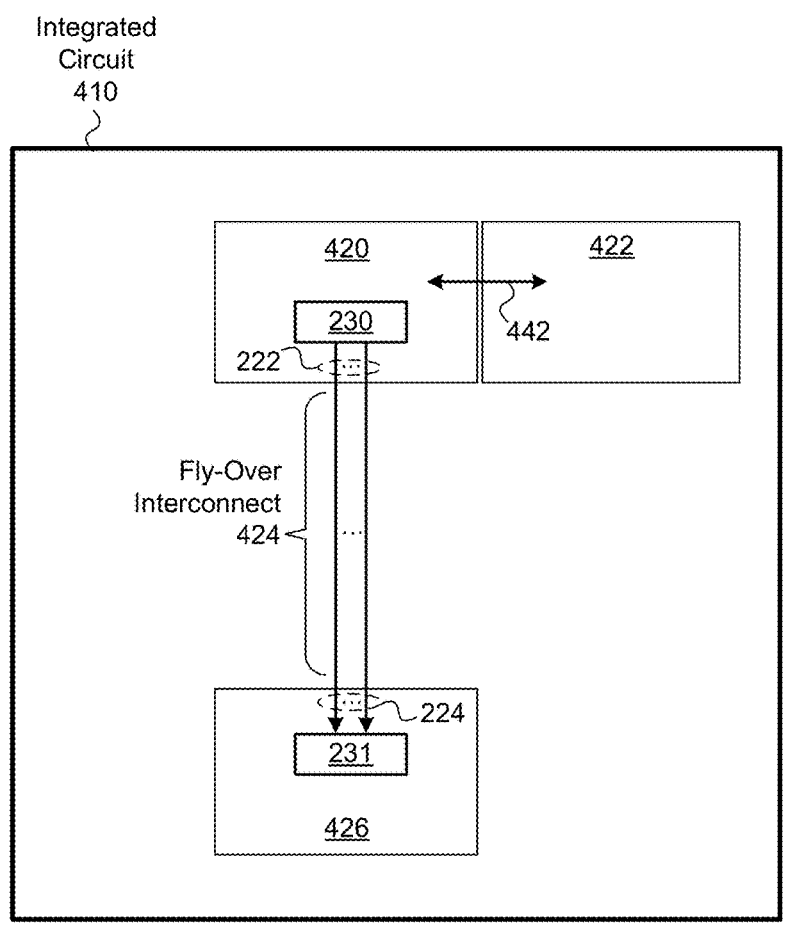
FIG. 4A illustrates a system comprising an integrated circuit and fly-over interconnect, in accordance with one embodiment.

FIG. 4A illustrates a system comprising an integrated circuit 410 and fly-over interconnect 424, in accordance with one embodiment. As shown, integrated circuit 410 includes circuit modules 420, 422, and 426, each fabricated within a local region of a single die within which the integrated circuit 410 is fabricated. Circuit module 420 may include data transmitter circuit, 230 coupled to fly-over interconnect 424. Circuit module 426 may include data receiver circuit 231, also coupled to fly-over interconnect 424. In one embodiment, fly-over over interconnect 424 comprises interconnect 238, and fly-over interconnect 424 transmits code words 222 from data transmitter circuit 230 to data receiver circuit 231. Certain circuit modules within integrated circuit 410 may also include local interconnects, such as local interconnect 442, which may implement any technically feasible signaling technique. In one embodiment, data transmitter circuit 230 is configured to implement steps 112 through 116 of method 110, described in FIG. 1A. Furthermore, fly-over interconnect 424 is configured to implement step 118 of method 110, and data receiver circuit 231 is configured to implement step 120 of method 110.

Figure 4B:
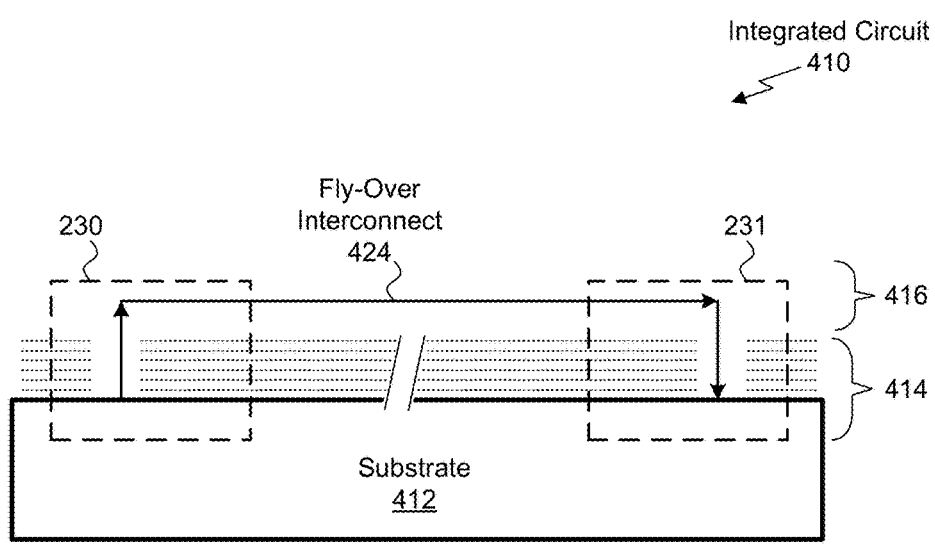
FIG. 4B illustrates a cross-section of an integrated circuit and a fly-over interconnect, in accordance with one embodiment.

FIG. 4B illustrates a cross-section view of an integrated circuit 410 and a fly-over interconnect 424, in accordance with one embodiment. As shown, integrated circuit 410 includes a substrate 412, active circuit layers 414, and upper metal layers 416. In one embodiment, the upper metal layers 416 are configured to implement fly-over interconnect 424. In alternative embodiments, any metal layers or any other conductive layers fabricated in conjunction with integrated circuit 410 may implement fly-over interconnect 424. Active circuit layers 414 may include diffusion layers fabricated within substrate 412, as well as layers fabricated at the surface of substrate 412 (metal layers, poly-silicon, dielectric layers, and other layers). In one embodiment, data transmitter circuit 230 and data receiver circuit 231 are disposed at opposite ends of fly-over interconnect 424.

Figure 4C:
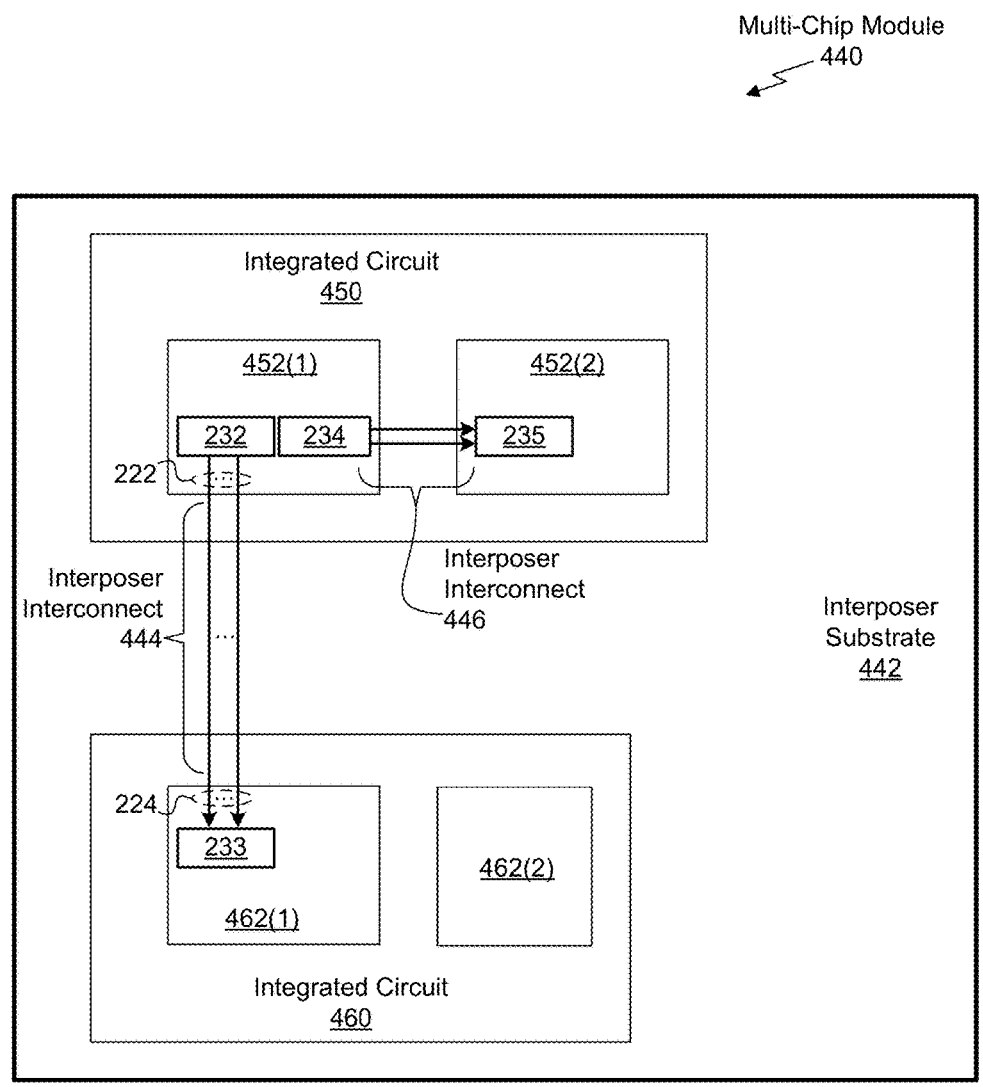
FIG. 4C illustrates a system comprising a multi-chip module with an interposer interconnect configured to couple a first integrated circuit to a second integrated circuit, in accordance with one embodiment

FIG. 4C illustrates a system comprising a multi-chip module 440 with an interposer interconnect 444 configured to couple a first integrated circuit 450 to a second integrated circuit 460, in accordance with one embodiment. The interposer interconnect 444 may be fabricated from two or more conductive layers of an interposer substrate 442. For example, the interposer interconnect 444 may be fabricated as two different metal layers of the interposer substrate 442. Each integrated circuit 450, 460, and the interposer substrate 442 may be fabricated from a common material (e.g., silicon) or materials having a substantially identical thermal coefficient of expansion. The multi-chip module 440 may further include a ball grid array (BGA) package comprising a ceramic substrate, an organic substrate, a silicon substrate, an epoxy or plastic enclosure, or any technically feasible combination thereof. In one embodiment, the interposer substrate 442 is coupled to the BGA package. Certain electrical signals may be coupled from the the interposer substrate 442 to input/output pins on the BGA package.

Integrated circuit 450 includes circuit modules 452, and integrated circuit 460 includes circuit modules 462. Circuit module 452(1) may include a data transmitter circuit 232, which may be implemented as an instance of data transmitter circuit 230 of FIG. 2A. Data transmitter circuit 232 may be configured to receive locally generated data words from circuit module 452(1) and transmit the data words as code words 222 through signal wires within interposer interconnect 444. The signal wires may be configured into wire groups, as illustrated above in FIGS. 3A-3H. Electrical connections between each integrated circuit 450, 460 and the interposer substrate 442 may be implemented as controlled collapse chip connection (C-4) connectors or joints (e.g., conductive balls). Circuit module 462(1) may include a data receiver circuit 233, configured to receive code words 224 that are inbound and correspond to code words 222. Data receiver circuit 233 may be implemented as an instance of data receiver circuit 231. Data transmitter circuit 232, interposer interconnect 444, and data receiver circuit 233 collectively provide high-speed chip-to-chip data communication between integrated circuit 450 and integrated circuit 460.

Circuit module 452(1) may also include data transmitter circuit 234, which may be implemented as an instance of data transmitter circuit 230. Circuit module 452(2) may include a data receiver circuit 235, which may be implemented as an instance of data receiver circuit 231. In one embodiment, an interposer interconnect 446 is configured to transmit code words from data transmitter circuit 234 to data receiver circuit 235. Data transmitter circuit 234, interposer interconnect 446, and data receiver circuit 235 collectively provide high-speed data communication between modules 452(1) and 452(2), both within integrated circuit 450.

In one embodiment, data transmitter circuit 232 is configured to implement steps 132 through 136 of method 130, described in FIG. 1B. Furthermore, interposer interconnect 444 is configured to implement step 138 of method 130, and data receiver circuit 233 is configured to implement step 140 of method 130. In another embodiment, data transmitter circuit 234 is configured to implement steps 132 through 136 of method 130. Furthermore, interposer interconnect 446 is configured to implement step 138 of method 130, and data receiver circuit 235 is configured to implement step 140 of method 130.

Figure 4D:
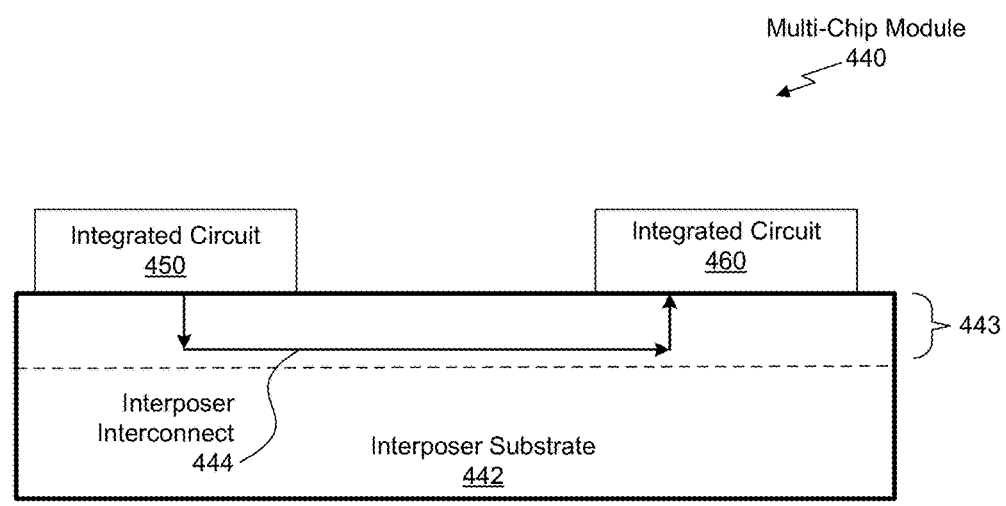
FIG. 4D illustrates a cross-section of a multi-chip module and interposer interconnect, in accordance with one embodiment.

FIG. 4D illustrates a cross-section of multi-chip module 440 and interposer interconnect 444, in accordance with one embodiment. Interposer substrate 442 may include a set of metal interconnect layers 443, including associated via layers for the metal layers. In one embodiment, metal layers 443 are configured to implement interposer interconnect 444. In another embodiment, metal layers 443 are configured to implement interposer interconnect 446.

Figure 5A:
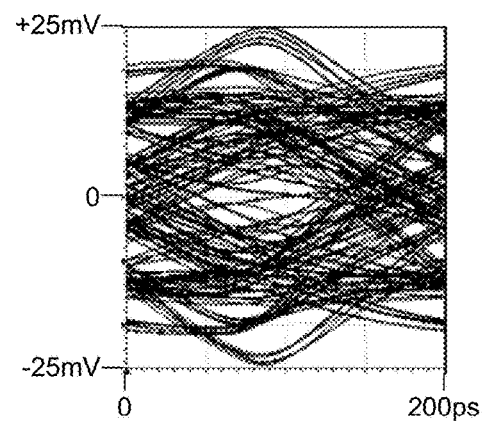
FIG. 5A illustrates an eye pattern for one signal channel of a conventional parallel interconnect subjected to random data.

FIG. 5A illustrates an eye pattern for one signal channel of a conventional parallel interconnect subjected to random data. The eye pattern is generated using transient simulation for a 5 Gbps signal traversing 6 mm in a wire group of six channels. As shown, conventional transmission techniques yield an essentially closed eye, with little chance of recovering data at a receiver circuit. Each wire was designed to have a width of approximately 0.499 um and a thickness of 0.85 um, with a spacing of 0.499 um.

Figure 5B:
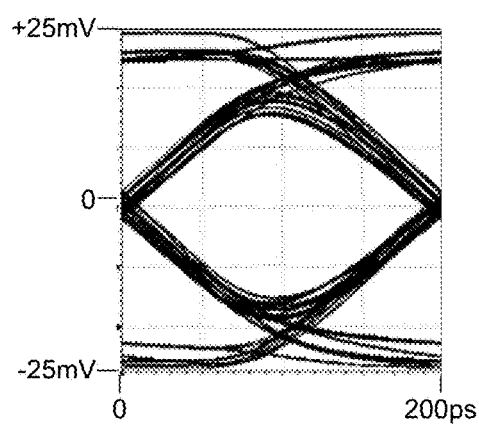
FIG. 5B illustrates an eye pattern for one signal channel of a single-twist interconnect subjected to balanced code data, in accordance with one embodiment.

FIG. 5B illustrates an eye pattern for one signal channel of a single-twist interconnect subjected to balanced code data, in accordance with one embodiment. Simulation conditions are essentially identical to those of FIG. 5A, however the interconnect is changed to a single-twist interconnect and balanced code data replaces the fully random data. In this scenario, the eye opens up and data recovery is significantly improved.

Figure 5C:
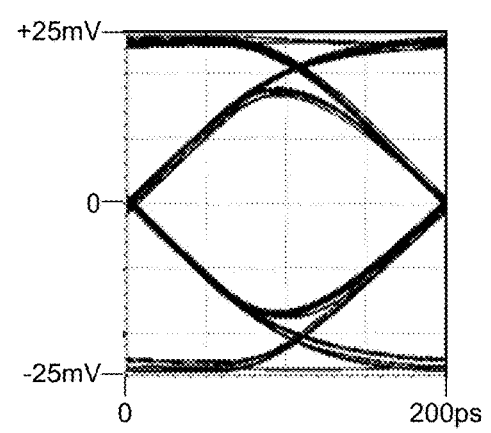
FIG. 5C illustrates an eye pattern for one signal channel of a double-twist interconnect subjected to balanced code data, in accordance with one embodiment.

FIG. 5C illustrates an eye pattern for one signal channel of a double-twist interconnect subjected to balanced code data, in accordance with one embodiment. Simulation conditions are essentially identical to those of FIG. 5B, however the interconnect is changed to a double-twist interconnect. Balanced code data is maintained and the eye opens up even more to yield a very clean signal with data recovery improved still further.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 6:
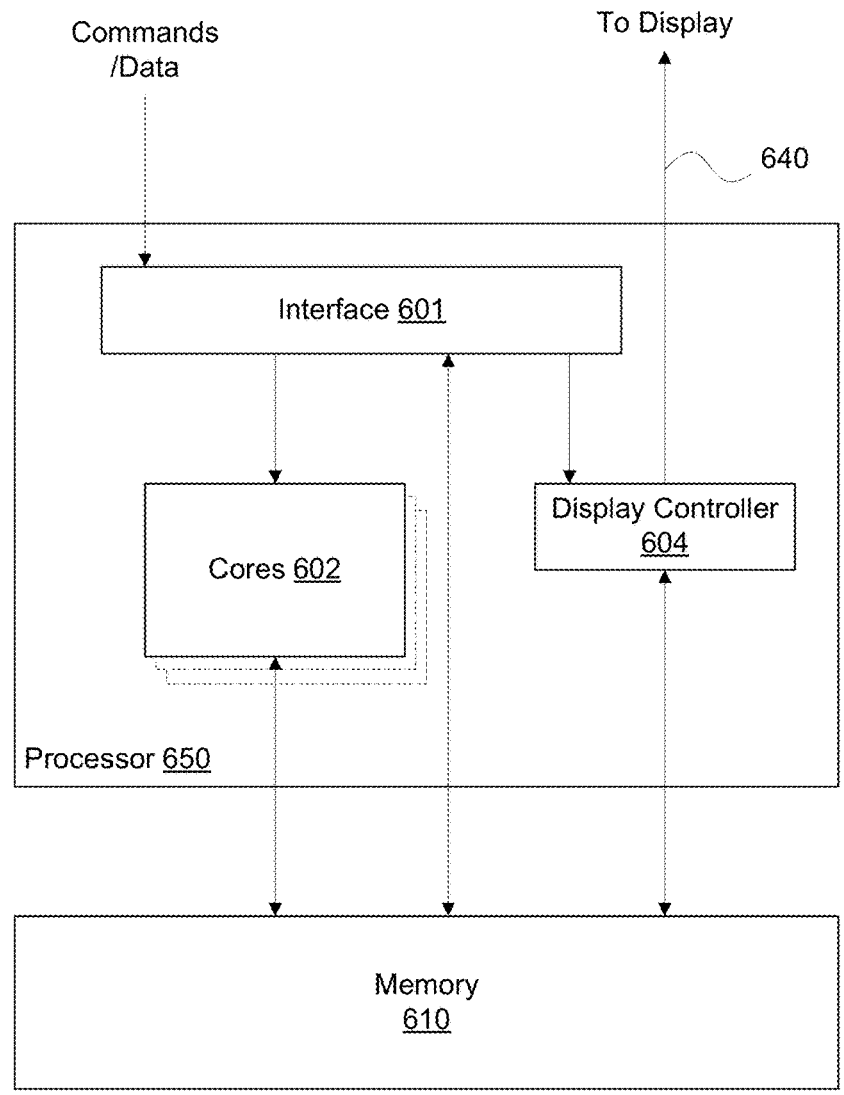
FIG. 6 illustrates a graphics processing unit, in accordance with one embodiment.

FIG. 6 illustrates the operation of a processor 650, in accordance with one embodiment. In one embodiment, as shown in FIG. 6, processor 650 is a graphics processing unit (GPU). In another embodiment, the processor 650 is general-purpose processor or a central processing unit (CPU). The processor 650 may be coupled to a memory 610. The memory 610 may be a synchronous dynamic random access memory (SDRAM) configured to store data accessible to the processor 650. In one embodiment, the memory 610 is a dedicated video memory that is only accessible by the processor 650. In another embodiment, the memory 610 is a system memory that is shared between a CPU (not shown) and the processor 650.

The processor 650 may receive commands and data from a CPU through an interface 601. The interface 601 may be, e.g., a PCIe (Peripheral Component Interconnect Express) interface that enables the processor 650 to communicate with the CPU and/or a system memory via a bus (not explicitly shown). The processor 650 may also include one or more cores 602 that process data based on the commands and/or programming instructions that may be stored within the processor 650 or within memory 610, or within any technically feasible memory subsystem. Each core 602 may be multi-threaded to process multiple data in parallel. In one embodiment, the cores 602 have a SIMD (Single-Instruction, Multiple Data) architecture. In SIMD architectures, a plurality of processing units process different data based on the same instruction. In another embodiment, the cores 602 have a MIMD (Multiple-Instruction, Multiple Data) architecture. In MIMD architectures, a plurality of processing units may be configured to process different data based on different instructions scheduled on each processing unit. In yet another embodiment, the cores 602 have a SIMT (Single-Instruction, Multiple-Thread architecture. In SIMT architectures, a plurality of processing units may be configured to process a plurality of related threads, each thread having the same instructions configured to process different data, but each thread capable of branching independently. In other words, individual threads may be masked to prevent execution of certain instructions in SIMT architectures. This enables conditional execution of the instructions associated with the plurality of threads. The processor 650 may also include a display controller 604 that is configured to transmit video data 640, such as according to a specification of a particular video signal interface. The display controller 604 may read the image data from a row or frame buffer in the memory 610 and convert the values stored in the row or frame buffer into video data 640.

In one embodiment, processor 650 is implemented as a single chip, such as integrated circuit 410 of FIGS. 4A-4B, and one or more of the interface 601, the cores 602, the display controller 604, and other modules within processor 650 may each include an instance of the data transmitter circuit 230 of FIG. 2A, an instance of the data receiver circuit 231, or a combination thereof. Instances of the data transmitter circuit may be coupled to instances of the data receiver circuit through a single-ended twisted-wire interconnect. In one such embodiment, the interconnect is a fly-over interconnect, such as fly-over interconnect 424. In another embodiment, the interconnect is an interposer interconnect, such as interposer interconnect 446.

In one embodiment, processor 650 is implemented as a multi-chip module, such as multi-chip module 440 of FIGS. 4C-4D, with different modules, such as the interface 601, the cores 602, the display controller 604, and other modules within processor 650 distributed among two or more different integrated circuits, wherein each module may include an instance of the data transmitter circuit 230 of FIG. 2A, an instance of the data receiver circuit 231, or a combination thereof. Instances of the data transmitter circuit may be coupled to instances of the data receiver circuit through a single-ended twisted-wire interconnect, such as interposer interconnect 444.

In certain embodiments, multi-chip module 440 includes memory 610, which may be implemented as one or more die, each configured to implement an SDRAM device. In general, any interconnect within processor 650 or within any other data processing system may be implemented using the techniques disclosed herein.

The various embodiments described above may be implemented in one or more of the central processor 701, graphics processor 706, and display 708 of system 700, described below.

Figure 7:
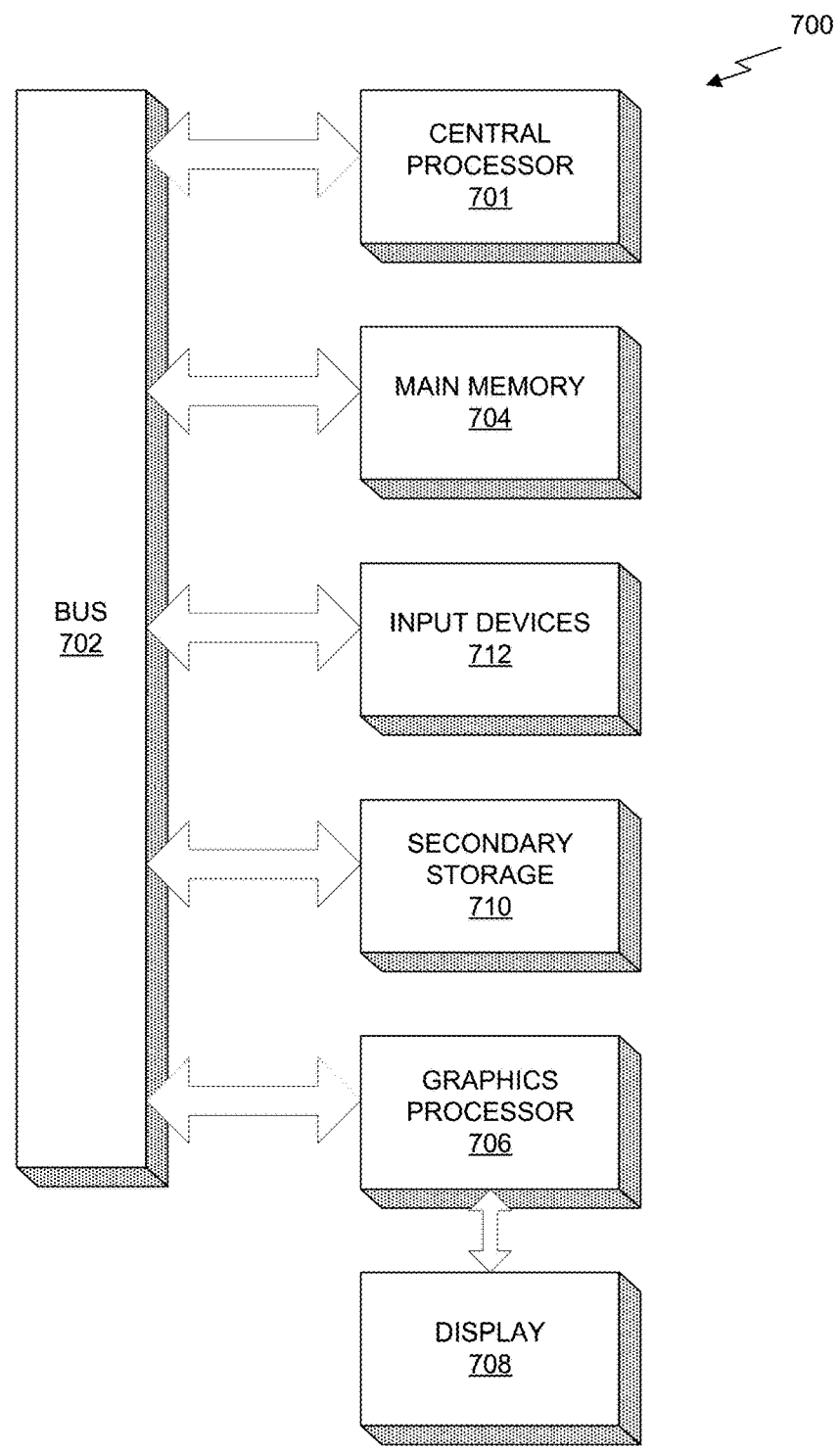
FIG. 7 illustrates an exemplary system in which the various architecture and/or functionality of the various previous embodiments may be implemented.

FIG. 7 illustrates an exemplary system 700 in which the various architecture and/or functionality of the various previous embodiments may be implemented. As shown, a system 700 is provided including at least one central processor 701 that is connected to a communication bus 702. The communication bus 702 may be implemented using any suitable protocol, such as PCI (Peripheral Component Interconnect), PCI-Express, AGP (Accelerated Graphics Port), HyperTransport, or any other bus or point-to-point communication protocol(s). The system 700 also includes a main memory 704. Control logic (software) and data are stored in the main memory 704 which may take the form of random access memory (RAM).

The system 700 also includes input devices 712, a graphics processor 706, and a display 708. In one embodiment, the graphics processor 706 comprises the GPU 650 and the central processor 701 comprises the CPU. User input may be received from the input devices 712, e.g., keyboard, mouse, touchpad, microphone, and the like. In one embodiment, the graphics processor 706 may include a plurality of shader modules, a rasterization module, etc. Each of the foregoing modules may even be situated on a single semiconductor platform to form a GPU.

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional CPU and bus implementation. Of course, the various modules may also be situated separately or in various combinations of semiconductor platforms per the desires of the user.

The system 700 may also include a secondary storage 710. The secondary storage 710 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 704 and/or the secondary storage 710. Such computer programs, when executed, enable the system 700 to perform various functions. The memory 704, the storage 710, and/or any other storage are possible examples of computer-readable media.

In one embodiment, the architecture and/or functionality of the various previous figures may be implemented in the context of the central processor 701, the graphics processor 706, an integrated circuit (not shown) that is capable of at least a portion of the capabilities of both the central processor 701 and the graphics processor 706, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 700 may take the form of a desktop computer, laptop computer, server, workstation, game consoles, embedded system, and/or any other type of logic. Still yet, the system 700 may take the form of various other devices including, but not limited to a personal digital assistant (PDA) device, a mobile phone device, a television, etc.

Further, while not shown, the system 700 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   receiving an input data word for transmission, wherein the input data word includes two or more independent bits of digital data;
   encoding the input data word into a code word; and
   driving the code word, by a data transmitter circuit within a first region of a single integrated circuit die, on to an interconnect for transmission to a data receiver circuit within a second region of the single integrated circuit die, wherein the interconnect is a single-ended, twisted-wire on-chip fly-over interconnect between the first and second regions within the single integrated circuit die and comprises a double-twist structure at each boundary, and
   the interconnect includes signal wires corresponding to bits comprising the code word, wherein the double-twist structure twists a first signal wire up at least one lane and twists a second signal wire down two lanes.

2. The method of claim 1, wherein the interconnect is physically structured to include a set of segments, each segment comprising at least three lanes of the signal wires routed in parallel and the first signal wire of the signal wires is placed in a different one of the lanes as the first signal wire traverses each boundary between adjacent segments.

3. The method of claim 2, wherein a number of the segments in the set of segments is an integer multiple of half a number of the signal wires.

4. A system, comprising:
   a single integrated circuit die fabricated to include:
      an interconnect, wherein the interconnect is a single-ended, twisted-wire on-chip fly-over interconnect between a first region and a second region within the single integrated circuit die and comprises a double-twist structure at each boundary; and
      a data transmitter circuit within the first region of the single integrated circuit die, configured to:
         receive an input data word for transmission, wherein the input data word includes two or more independent bits of digital data;
         encode the input data word into a code word; and
         drive the code word on to the interconnect for transmission, wherein the interconnect includes signal wires corresponding to bits comprising the code word and the double-twist structure twists a first signal wire up at least one lane and twists a second signal wire down two lanes; and
      a data receiver circuit fabricated within the second region of the single integrated circuit die and coupled to the interconnect to receive the code word.

5. The system of claim 4, wherein the data receiver circuit is configured to decode the code word to generate an output data word, and the output data word is equivalent to the input data word.

6. The system of claim 4, wherein the code word exhibits an equal number of low-going and high-going transitions for an arbitrary code word transition.

7. The system of claim 4, wherein the interconnect is physically structured to include a set of segments, each segment comprising at least three lanes of the signal wires routed in parallel and the first signal wire of the signal wires is placed in a different one of the lanes as the first signal wire traverses each boundary between adjacent segments.

8. The system of claim 7, wherein a number of the segments in the set of segments is an integer multiple of half a number of the signal wires.

9. The system of claim 7, wherein the interconnect is structured to include a number of segments equal in number to a number of signal wires associated with the code word.

10. The system of claim 4, wherein the single integrated circuit die further comprises a processing unit.

11. An apparatus, comprising:
a single integrated circuit die fabricated to include:
an interconnect, wherein the interconnect is a single-ended, twisted-wire on-chip fly-over interconnect between a first region and a second region within the single integrated circuit die and comprises a double-twist structure at each boundary; and
a data transmitter circuit within a first region of the single integrated circuit die, configured to:
receive an input data word for transmission, wherein the input data word includes two or more independent bits of digital data;
encode the input data word into a code word; and
drive the code word on to the interconnect for transmission, wherein the interconnect includes signal wires corresponding to bits comprising the code word and the double-twist structure twists a first signal wire up at least one lane and twists a second signal wire down two lanes; and
a data receiver circuit that is configured to receive the code word that is transmitted through the interconnect.

12. The apparatus of claim 11, wherein the data word comprises four independent bits of digital data and the code word includes six bits of digital data.

13. The apparatus of claim 11, wherein the code word is generated to be a balanced code word.

14. The apparatus of claim 13, wherein the balanced code word exhibits an equal number of low-going and high-going transitions for an arbitrary code word transition.

15. The apparatus of claim 11, wherein each bit of the code word is phase-aligned during transmission.

16. The apparatus of claim 11, wherein the data receiver circuit is further configured to decode the code word to generate an output data word, wherein the output data word is equivalent to the input data word.

17. The apparatus of claim 11, wherein the interconnect is physically structured to include a set of segments, each segment comprising at least three lanes of the signal wires routed in parallel and the first signal wire of the signal wires is placed in a different one of the lanes as the first signal wire traverses each boundary between adjacent segments.

18. The apparatus of claim 17, wherein a number of the segments in the set of segments is an integer multiple of half a number of the signal wires.

19. The apparatus of claim 17, wherein the interconnect is structured to include a number of segments equal in number to a number of signal wires associated with the code word.

* * * * *

UNITED STATES PATENT AND TRADEMARK OFFICE
CERTIFICATE OF CORRECTION

PATENT NO. : 10,312,967 B2
APPLICATION NO. : 14/970415
DATED : June 4, 2019
INVENTOR(S) : Xi Chen Page 1 of 1

It is certified that error appears in the above-identified patent and that said Letters Patent is hereby corrected as shown below:

In the Specification

Column 1 Line 4 Please add the following paragraph before the Field of Invention paragraph:
-- STATEMENT REGARDING FEDERALLY SPONSORED RESEARCH AND DEVELOPMENT
This invention was made with US Government support under LLNS subcontract B609487 awarded by DOE, and under Agreement HR0011-13-3-0001 awarded by DARPA. The US Government has certain rights in this invention. --

Signed and Sealed this
Fourteenth Day of July, 2020

Andrei Iancu
*Director of the United States Patent and Trademark Office*